US008344801B2

(12) United States Patent
Owen et al.

(10) Patent No.: US 8,344,801 B2
(45) Date of Patent: Jan. 1, 2013

(54) VARIABLE CLASS CHARACTERISTIC AMPLIFIER

(75) Inventors: Christopher Michael Owen, Pittsford, NY (US); Yogendra K. Chawla, Fairport, NY (US)

(73) Assignee: MKS Instruments, Inc., Andover, MA (US)

( * ) Notice: Subject to any disclaimer, the term of this patent is extended or adjusted under 35 U.S.C. 154(b) by 49 days.

(21) Appl. No.: 12/763,640

(22) Filed: Apr. 20, 2010

(65) Prior Publication Data

US 2011/0241781 A1 Oct. 6, 2011

Related U.S. Application Data

(60) Provisional application No. 61/320,541, filed on Apr. 2, 2010.

(51) Int. Cl.
*H03F 3/217* (2006.01)

(52) U.S. Cl. ............... 330/251; 330/207 A; 330/196

(58) Field of Classification Search .................. 330/251, 330/262–264, 207 A, 10
See application file for complete search history.

(56) References Cited

U.S. PATENT DOCUMENTS

| 3,493,878 | A | 2/1970 | Fautale |
| 3,636,380 | A | 1/1972 | Anderson |
| 3,899,745 | A | 8/1975 | Fletcher et al. |
| 3,919,656 | A | 11/1975 | Sokal et al. |
| 3,939,380 | A | 2/1976 | Peer |
| 4,021,748 | A | 5/1977 | Yoshida et al. |
| 4,042,890 | A | 8/1977 | Eckerle |
| 4,047,120 | A | 9/1977 | Lord et al. |
| 4,067,057 | A | 1/1978 | Taddeo et al. |
| 4,173,739 | A | 11/1979 | Yoshida et al. |
| 4,182,992 | A | 1/1980 | Attwood et al. |
| 4,268,898 | A | 5/1981 | Brown |
| 4,408,267 | A | 10/1983 | Pruitt |
| 4,429,339 | A | 1/1984 | Jaeschke et al. |
| 4,455,600 | A | 6/1984 | Bobry |
| 4,509,101 | A | 4/1985 | Kenji et al. |
| 4,511,823 | A | 4/1985 | Eaton et al. |
| 4,550,359 | A | 10/1985 | West |
| 4,560,851 | A | 12/1985 | Tsukamoto et al. |
| 4,564,879 | A | 1/1986 | Bienstman et al. |
| 4,600,891 | A | 7/1986 | Taylor, Jr. et al. |
| 4,639,849 | A | 1/1987 | Noworolski et al. |
| 4,670,832 | A | 6/1987 | Park |
| 4,691,270 | A | 9/1987 | Pruitt |

(Continued)

FOREIGN PATENT DOCUMENTS

AT 342713 4/1978

(Continued)

OTHER PUBLICATIONS

Alan Siu Kei Poon, ECE 1352F Analog Integrated Circuits I, Reading Assignment—RF Power Amplifiers.

(Continued)

*Primary Examiner* — Hieu Nguyen (74) *Attorney, Agent, or Firm* — Harness, Dickey & Pierce, P.L.C.

(57) ABSTRACT

A power amplifier (PA) adjustably operable between two classes of operation. The range of operation lies in a range of operation between a conventional, linear, conjugately matched Class AB characteristic amplifier and a higher efficiency switching Class E characteristic amplifier. A circuit topology having a push-pull configuration that allows a Class E characteristic of operation.

46 Claims, 8 Drawing Sheets

U.S. PATENT DOCUMENTS

| | | |
|---|---|---|
| 4,709,323 A | 11/1987 | Lien |
| 4,719,556 A | 1/1988 | Wise |
| 4,720,775 A | 1/1988 | Cathell |
| 4,725,762 A | 2/1988 | Jagschitz et al. |
| 4,739,463 A | 4/1988 | Barna et al. |
| 4,743,858 A | 5/1988 | Everard |
| 4,745,537 A | 5/1988 | Cheung et al. |
| 4,910,416 A | 3/1990 | Salcone |
| 4,914,399 A | 4/1990 | Doany |
| 4,916,599 A | 4/1990 | Traxler et al. |
| 4,992,749 A | 2/1991 | Tokumo et al. |
| 5,019,770 A | 5/1991 | Harada et al. |
| 5,023,566 A | 6/1991 | El-Hamamsy et al. |
| 5,045,989 A | 9/1991 | Higaki et al. |
| 5,065,300 A | 11/1991 | Jacobson et al. |
| 5,077,651 A | 12/1991 | Kobayashi et al. |
| 5,117,167 A | 5/1992 | Kazmirski |
| 5,117,198 A | 5/1992 | Morenz |
| 5,151,852 A | 9/1992 | Jacobson et al. |
| 5,187,580 A | 2/1993 | Porter, Jr. et al. |
| 5,196,995 A | 3/1993 | Gulczynski |
| 5,218,315 A | 6/1993 | Turner |
| 5,303,139 A | 4/1994 | Mark |
| 5,314,603 A | 5/1994 | Sugiyama et al. |
| 5,367,228 A | 11/1994 | Kachmarik et al. |
| 5,471,376 A | 11/1995 | Tsai et al. |
| 5,610,553 A | 3/1997 | Kirn |
| 5,638,266 A | 6/1997 | Horie et al. |
| 5,717,293 A | 2/1998 | Sellers |
| 5,747,935 A | 5/1998 | Porter et al. |
| 5,747,942 A | 5/1998 | Ranganath |
| 5,757,942 A | 5/1998 | Kamatani et al. |
| 5,838,193 A | 11/1998 | Myers et al. |
| 5,909,086 A | 6/1999 | Kim et al. |
| 5,910,886 A | 6/1999 | Coleman |
| 5,917,382 A | 6/1999 | Chiozzi et al. |
| 5,952,794 A | 9/1999 | Bergman et al. |
| 5,963,086 A | 10/1999 | Hall |
| 5,973,437 A | 10/1999 | Gradzki et al. |
| 5,982,231 A | 11/1999 | Nalbant |
| 5,991,167 A | 11/1999 | Van Lerberghe et al. |
| 5,994,848 A | 11/1999 | Janczak |
| 6,016,075 A | 1/2000 | Hamo |
| 6,016,258 A | 1/2000 | Jain et al. |
| 6,043,607 A | 3/2000 | Roderick |
| 6,046,546 A | 4/2000 | Porter et al. |
| 6,072,362 A | 6/2000 | Lincoln |
| 6,088,051 A | 7/2000 | Barraud et al. |
| 6,088,052 A | 7/2000 | Guralnick et al. |
| 6,091,288 A | 7/2000 | Moisin |
| 6,469,919 B1 | 10/2002 | Bennett |
| 6,618,276 B2 | 9/2003 | Bennett |
| 6,784,732 B2 * | 8/2004 | Hajimiri et al. ............... 330/251 |
| 6,885,567 B2 | 4/2005 | Lincoln et al. |
| 7,092,691 B2 * | 8/2006 | Bohn et al. .................... 455/280 |
| 7,714,649 B1 * | 5/2010 | Cripe ............................ 330/251 |
| 2008/0252382 A1 | 10/2008 | Takagi |

FOREIGN PATENT DOCUMENTS

| | | |
|---|---|---|
| AT | 375499 | 8/1984 |
| AT | 380373 | 5/1986 |
| AT | 383000 | 5/1987 |
| AT | 384339 | 10/1987 |
| AT | 386103 | 7/1988 |
| AT | 392384 | 8/1991 |
| DE | 19522369 A1 | 1/1997 |
| EP | 0358191 | 3/1990 |
| EP | 0419230 | 3/1991 |
| EP | 0481304 | 4/1992 |
| FR | 2911447 A1 | 7/2008 |
| GB | 2131236 | 6/1984 |
| GB | 2175154 | 11/1986 |
| GB | 2197550 | 5/1988 |
| GB | 2199184 | 6/1988 |
| GB | 2225497 | 5/1990 |
| GB | 2249226 | 4/1992 |
| GB | 2293505 | 3/1996 |
| SU | 669341 | 6/1979 |
| SU | 928326 | 5/1982 |
| WO | 8501844 | 4/1985 |
| WO | 2009/060214 A1 | 5/2009 |

OTHER PUBLICATIONS

International Search Report for International Patent Application No. PCT/US2011/021455 dated May 2, 2011.

Daehyun Kang et al: "A Highly Efficient and Linear Class-AB/F Power Amplifier for Multimode Operation", IEEE Transactions on Microwave Theory and Techniques, IEEE Service Center, Piscataway, NJ, US, vol. 56, No. 1, Jan. 1, 2008, pp. 77-87.

Yarleque Medina M A et al: "WiMax class AB and class E power amplifier design using equivalent capacitance concept". International Journal of RF and Microwave Computer-Aided Engineering, Wiley, New York, NY, US, vol. 18, No. 6, Nov. 1, 2008, pp. 543-551.

* cited by examiner

VARIABLE CLASS CHARACTERISTIC AMPLIFIER

CROSS-REFERENCE TO RELATED APPLICATIONS

This application claims the benefit of U.S. Provisional Application No. 61/320,541, filed on Apr. 2, 2010. The entire disclosure of the above application is incorporated herein by reference.

FIELD

The present disclosure relates to power amplifiers and to power amplifiers having characteristics of more than one class of amplifier.

BACKGROUND

This section provides background information related to the present disclosure which is not necessarily prior art.

Various industries use radio frequency (RF) to drive plasma chambers in order to fabricate various components such as integrated circuits, solar panels, compact disks (CDs), digital versatile (or video) discs (DVDs), and the like. Each fabrication process can vary depending upon the particular component being manufactured. The various processes often call for delivery of RF energy at varying frequencies, power levels, and efficiencies.

Present RF power delivery systems tend to be specifically tailored to the requirements of the particular plasma manufacturing process. RF power amplifiers and generators are thus not typically interchangeable or easily modified to accommodate various applications. Rather, each application typically has its own requirements, usually necessitating changing the RF power amplifier and/or the RF power generator.

In one example, some plasma manufacturing processes call for a power amplifier that operates in a mode characteristic of a class AB power amplifier. In a mode of operation characteristic of Class B operation, approximately half of the input wave cycle is amplified by a first switch, and the other half of the input wave cycle is amplified by a second switch operating in a complementary manner. Class AB operation is typically further exemplified by each device conducting a small amount during the portion of the cycle when it is generally off. This reduces the dead zone, or period when both devices are simultaneously substantially off, which minimizes or eliminates crossover. Class AB amplifiers typically trade off efficiency in favor of linearity and greater power output. In conventional power amplifiers, class AB efficiency is limited to about 70%.

Other manufacturing processes call for a power amplifier that operates in a mode characteristic of a Class E power amplifier. Class E operation is typically implemented using a switching power amplifier. Class E amplifiers are known to be arranged in a single ended configuration, as opposed to the push-pull configuration of Class AB amplifiers. For example, a switching device is connected at its output to a circuit having an inductor and capacitor in series (a serial LC circuit) connected to the load and connected to a supply voltage through a large inductance. In operation, the on state of a Class E amplifier occurs when voltage is at or near zero across the switch when high current is flowing through the switch element. The off state of a Class E amplifier occurs when the voltage across the switch is high and current flowing through the switch is at or near zero. That is, the switch acts as a low-resistance closed switch during the on part of the RF cycle, and acts as an open switch during the off part of the RF cycle. Class E amplifiers typically trade off power output in favor of efficiency and other benefits. Class E efficiency is typically at least 85% and can be as high as 95%. Typical Class E amplifiers are typically less stable into high voltage standing wave ratio (VSWR) load mismatches.

Returning to the RF plasma manufacturing process, manufacturers may have a need for a Class AB characteristic power amplifier to provide RF power for a plasma process for certain applications. The same manufacturer, in other applications, may require a Class E characteristic power amplifier to provide RF power for a different plasma process. The manufacturer prefers to achieve either Class AB or Class E characteristic operation from a single device in order to achieve flexibility and minimize costs. Manufacturers have not yet been able to meet this customer requirement.

Conventional power amplifiers include a network including a capacitor and an inductor at an output prior to connection to a load. Such networks may also include an additional capacitor and may be referred to as a CLC network. Power amplifier designers have typically used the CLC networks to shape or condition the output signal prior to application to the load. The CLC networks may also reject transients and out of band energy reflected back from the load. However, the use of such CLC networks has been limited to these applications, and other applications of the CLC network have not been considered.

SUMMARY

This section provides a general summary of the disclosure, and is not a comprehensive disclosure of its full scope or all of its features.

A power amplifier including a switch module which receives an input signal and generates a switch module signal in accordance with the input signal. An output module receives the switch module signal and generating an output signal. The power amplifier operates in a plurality of modes characteristic of a plurality of power amplifier classes, and the configuration of the output module is varied to effect operation between the modes for the input signal.

A power amplifier includes a switch module which receives an input signal and generates a switch module signal in accordance with the input signal. An output module receives the switch module signal and generates an output signal. The output module includes at least a capacitor and an inductor. The power amplifier operates in a plurality of modes characteristic of a plurality of power amplifier classes. The value of the capacitor is varied to effect operation between the modes for the input signal.

A power amplifier includes a first switch module which is responsive to an input signal to generate a first switch module signal in accordance with the input signal. A second switch module is arranged in a push-pull configuration with the first switch module. The second switch module is responsive to the input signal to generate a second switch module signal in accordance with the input signal. The first and second switch module signals cooperate to generate a composite switch module signal. An output module receives the composite switch module signal and generates an output signal. The power amplifier operates in a plurality of modes characteristic of a plurality of power amplifier classes, and the configuration of the output module is varied to effect operation between the modes for the input signal.

A power amplifier includes a first switch module, the first switch module is responsive to an input signal to generate a first switch module signal in accordance with the input signal. A second switch module is arranged in a push-pull configuration with the first switch module. The second switch module is responsive to the input signal to generate a second switch module signal in accordance with the input signal. The first and second switch module signals cooperate to generate a composite switch module signal. An output module receives the composite switch module signal and generates an output signal. The output module includes a first capacitive element and an inductive element. The power amplifier operates in a plurality of modes characteristic of a plurality of power amplifier classes, and the value of the capacitive element is varied to effect operation between the modes.

A power amplifier includes a first switching device responsive to an input signal to generate a first switching device signal. A second switching device is arranged in a push-pull configuration with the first switching device. The second switching device is responsive to the input signal to generate a second switching device signal, the first and second switching device signals cooperating to generate a composite switching device signal. An output module receives the composite switching device signal and generates an output signal. The output module includes a first capacitor and an inductor. The power amplifier operates in a plurality of modes characteristic of one of Class AB or Class E power amplifier classes. The value of the capacitor is varied to effect operation between the modes.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
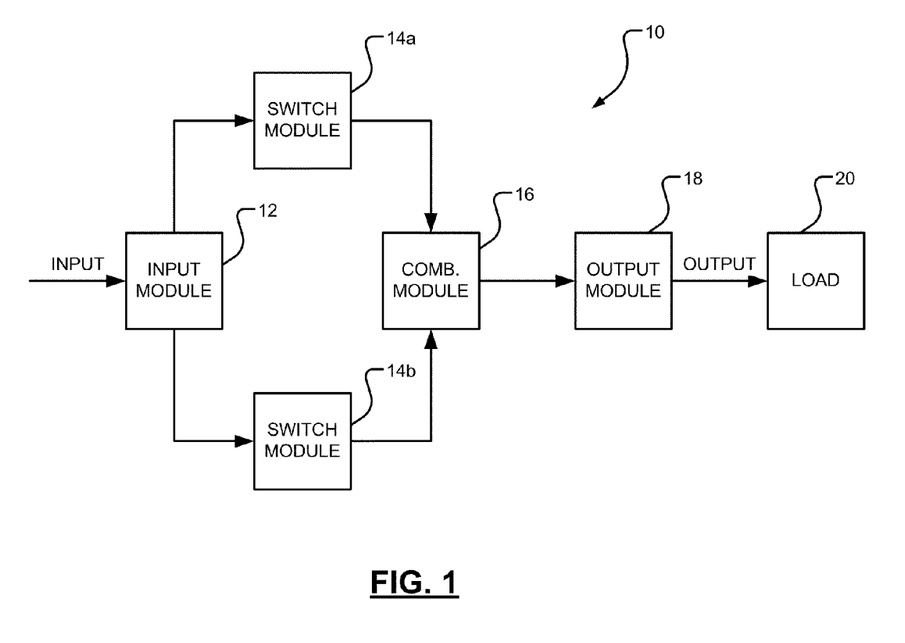
FIG. 1 is a block diagram of a variable class characteristic amplifier arranged in accordance with the principles of the present disclosure.

With reference to the figures and according to various embodiments, the variable class characteristic amplifier will be described herein. FIG. 1 depicts a block diagram of a variable class characteristic amplifier 10. An input signal is applied to an input module 12. The input signal could be any of a number of oscillating signals, including a signal operating in the radio frequency (RF) band. Input module 12 receives the input signal and communicates the input signal to a pair of switch modules 14a, 14b. Input module 12 provides impedance transformation between the input to input module 12 and switch modules 14a and 14b.

Switch modules 14a, 14b receive the signals output from input module 12 and generate amplified signals applied to combiner module 16. Combiner module 16 combines the amplified signals output from respective switch modules 14a, 14b and generates a signal to output module 18. According to other various embodiments, combiner module 16 also provides impedance transformation between switch modules 14a, 14b and output module 18.

Output module 18 receives the signal from combiner module 16 and, according to various embodiments, can provide filtering and/or conditioning to generate an output signal from output module 18. The output signal is applied to a load 20 to drive load 20. In various embodiments, load 20 may be any of a number of elements or devices driven by a RF signal, including, by way of non-limiting example, a plasma chamber.

Figure 2:
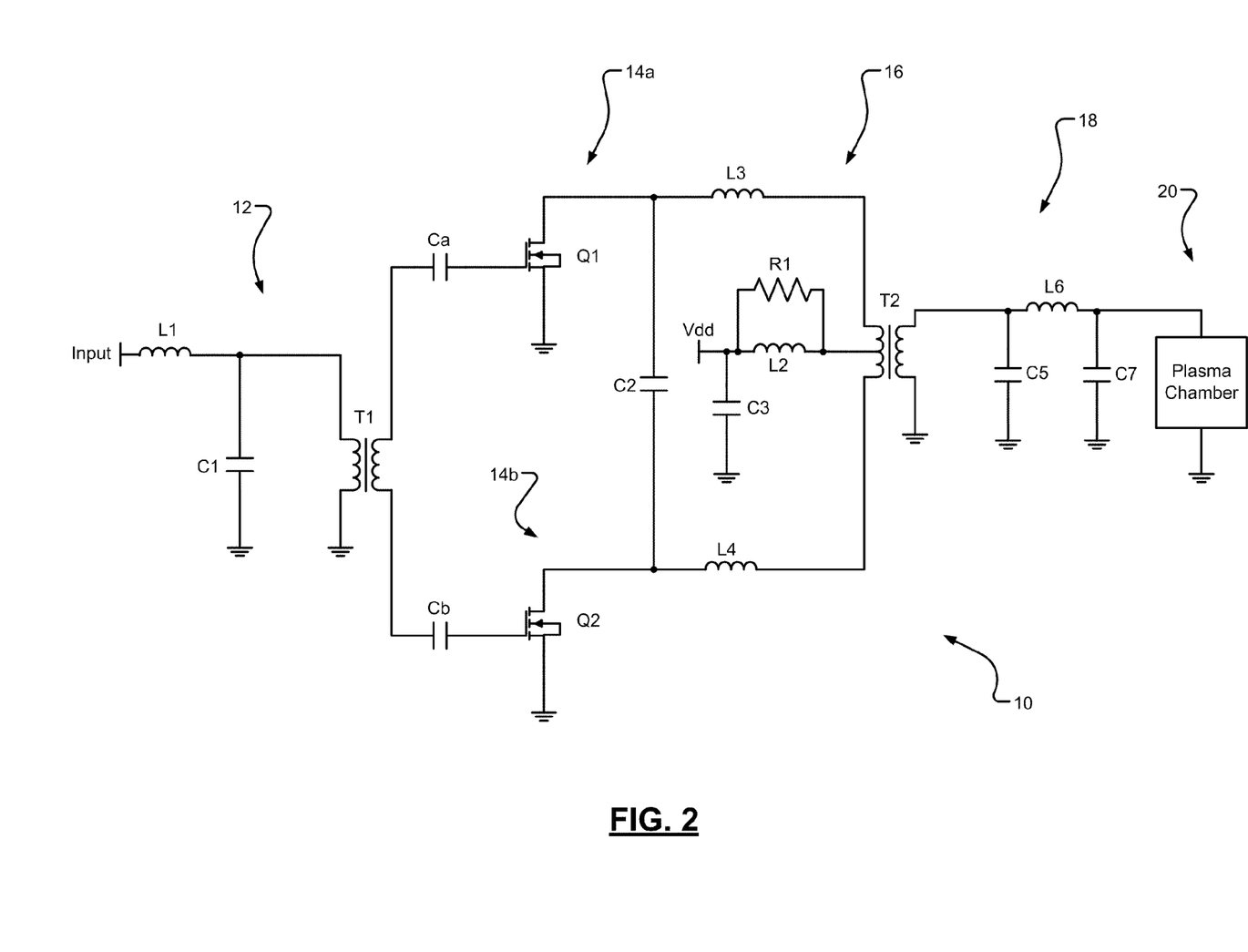
FIG. 2 is a circuit diagram of variable class characteristic amplifier arranged in accordance with the principles of the present disclosure.

FIG. 2 depicts a circuit in which various elements form portions of the modules of FIG. 1. The input signal is applied to input module 12, which includes an inductor L1, capacitor C1, and transformer T1. Inductor L1 and capacitor C1 cooperate to provide an LC circuit that provides impedance transformation to match a predetermined input impedance, such as 50 ohms. Transformer T1 receives the input signal at a primary winding and transforms the input signal across a core to a secondary winding of T1. In various embodiments, transformer T1 is a single ended to balanced transformer with a floating center tap. The secondary winding of T1 connects to respective switch modules 14a, 14b. Switch module 14a includes blocking capacitor Ca and switching element Q1. Likewise, switch module 14b includes blocking capacitor Cb and switch element Q2. In various embodiments, switch elements Q1, Q2 can be embodied as any of a number of various transistor switch elements, including MOSFET devices. The output terminals or drains of switch elements Q1 and Q2 are connected by a capacitor C2. In various embodiments, capacitor C2 may be provided across switches Q1 and Q2 by the drain-source output capacitance of each respective switch element Q1 and Q2. In various other embodiments, C2 may be implemented as an external capacitor.

The outputs from each switch element Q1, Q2 connect to opposite terminals of a primary winding of output transformer T2. Combiner module 16 includes inductors L3, L4, voltage source Vdd, capacitor C3, inductor L2, resistor R1, and transformer T2. Vdd connects to the center tap of primary winding of transformer T2 in series with the parallel connection of resistor R1 and inductor L2. Thus, the power supply feed RF choke is provided in large proportion by the center pin of primary winding of output transformer T2 and provides the power supply RF choke for each of respective switch elements Q1, Q2. Capacitor C3 provides filtering of the input voltage Vdd. Inductors L3 and L4, according to various embodiments, may be implemented as external inductors or may be provided by transformer T2 leakage inductance. Resistor R1 can compensate for high voltage standing wave ratio (VSWR) transient or out of band energy dissipation.

As mentioned above, inductors L3, L4 may be provided by the leakage inductance of an output transformer T2. Output transformer T2 may be a balanced output transformer having a turns ratio to provide necessary impedance transformation and leakage inductance. In various embodiments, with the transformer T2 secondary connected to a 50Ω load, transformer T2 transforms the 50Ω impedance to a selected impedance at the primary, which is then the load impedance seen between the output terminals of switch elements Q1, Q2. The printed circuit board tracks from the, for example, output terminals of switch elements Q1, Q2 to the primary winding inputs each add a further inductance, depending on the track length and width.

Switch modules 14a, 14b are arranged in a push-pull configuration across combiner module 16. More particularly, the output terminals of switch elements Q1, Q2 connect to end terminals of the primary winding of transformer T2 via inductances L3, L4. This configuration provides a push-pull arrangement across transformer T2 with the voltage supply Vdd for each respective output terminal of switch elements Q1, Q2 provided by the center pin of the primary winding of transformer T2. Thus, supply voltage Vdd provides a supply voltage to output terminal of switch elements Q1, Q2 via supply feed RF choke L2.

The secondary winding of transformer T2 has a first terminal connected to ground and a second terminal connected to output module 18. Output module 18 includes capacitors C5, C7, and inductor L6 arranged in a CLC network. Output module 18 generates an output signal to load 20, which is shown in FIG. 2 as a plasma chamber. One skilled in the art, however, will recognize that load 20 may be other than a plasma chamber and may be any load responsive to an oscillating power signal input, such as an RF signal input. The CLC circuit of output module 18 may be embodied as an equivalent circuit including a series output capacitance connected between the secondary winding of transformer T2 and the plasma chamber.

In various embodiments, a series output capacitance is transformed to the primary winding of transformer T2 from the series capacitive reactance of the output CLC network. Omitting the series output capacitance on the primary side is useful in various embodiments because DC decoupling is not required and also the peak currents are lower on the secondary side. Similarly, a resistance is provided by the real part of the output CLC network of output module 18, which is then also transformed by the transformer ratio. In various embodiments, the output network Q=2 is low and provides wider bandwidth and greater stability.

According to various embodiments, the system of FIGS. 1 and 2 can be operated in a mode characteristic of Class AB in a first configuration, in a mode characteristic of Class E in a second configuration, and in a mode intermediate to Classes AB and E characteristics. For a given input signal, the circuit can be tuned between a mode characteristic of Class AB in a first configuration and a mode characteristic of Class E in a second configuration. By way of non-limiting example, by varying the values of capacitors C5 and C7, operation between Class AB and Class E characteristics can be achieved for a given input signal. In the various embodiments, adjustment of C7 and C5 in the output CLC network allows the operation of the variable class characteristic power amplifier 10 to vary in a continuous range between Class AB and Class E characteristics of operation. In various embodiments, by raising the value of capacitor C7, operation can be tuned towards Class E characteristic and away from Class AB characteristic. Likewise, by lowering the capacitance of C7, operation of variable class amplifier 10 can be varied from Class E characteristic operation towards Class AB characteristic operation. The value of capacitor C5 is also varied to enable operation between the Class E and Class AB characteristics. The various embodiments thus provide a power amplifier having Class E characteristics of operation in a push-pull configuration. The various embodiments also disclose an amplifier tunable between Class AB characteristics of operation and Class E characteristics of operation.

Regarding the tuning from Class E and Class AB characteristic operation, various embodiments may employ the following procedure. The value of C7 may increased by about 15%. This raises the real part of the impedance at the transformer secondary (and primary) by 15%, thus reducing the Q of the series LC resonance of the equivalent network. Changing C7 also has the effect of reducing the center frequency of the series LC resonance, so to re-center the resonant frequency. The value of C5 is then reduced by approximately 6%. To tune from Class AB to Class E characteristics of operation, the reverse applies. In various other embodiments to shift from a class AB characteristic to a Class E characteristic of operation, the real portion of the output impedance may be decreased by about 33% and the imaginary portion of the output impedance can be decreased by approximately 50%, as can be seen in connection with FIG. 7.

In various embodiments, the transistor conduction angle does not change substantially, but the amount of time that the drain voltage spends at or near 0V does change. In class AB characteristic operation, the drain voltage spends little time at 0V at full output power. In Class E characteristic operation, the drain voltage spends an extended portion of the down cycle at or near 0V. When the transistor is conducting with a low drain voltage, the transistor dissipation is lower and hence the power amplifier efficiency is higher. Also in Class AB characteristic operation, the switch elements Q1, Q2 are often biased by a direct current (DC) with the usual associated conduction angle, as shown. Thus, the variable class characteristic amplifier 10 enables adjustment between modes characteristic of various amplifier classes, such as Class E and Class AB characteristics of operation.

Figure 3A:
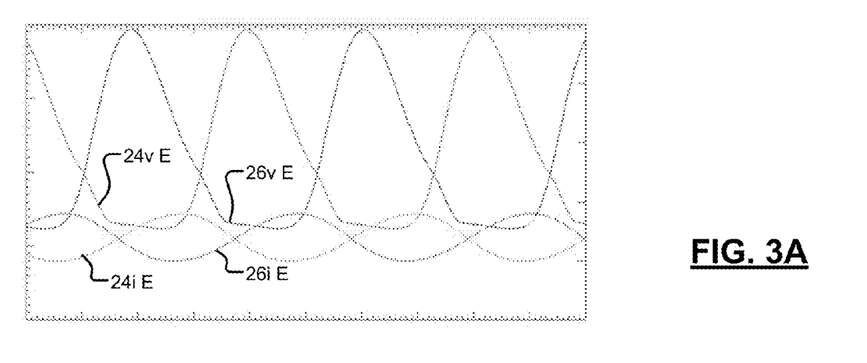
FIGS. 3A-3C depicts example waveforms of the output terminal voltage and output terminal current in various characteristics of operation of a variable class characteristic amplifier arranged in a push-pull configuration in accordance with the principles of the present disclosure.
Figure 3B:
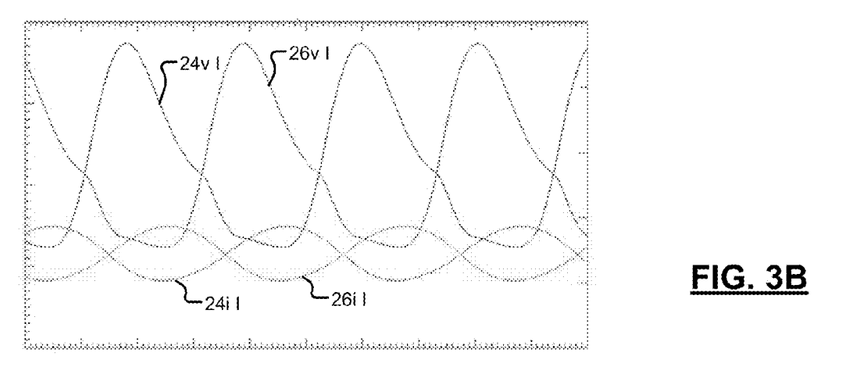
Figure 3C:
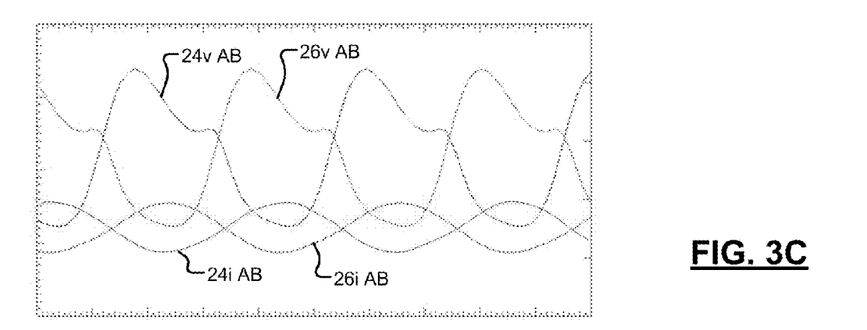

FIGS. 3A-3C are example plots showing voltage and current waveforms at the output terminals (the drains of Q1, Q2) of switch modules 14a, 14b for an example embodiment of a 60 MHz variable class characteristic power amplifier arranged according to various embodiments. FIGS. 3A-3C demonstrate an example relationship between output terminal voltage and output terminal current for respective Class E, intermediate, and Class AB characteristic modes of operation. Waveforms 24v E and 24i E indicate respective voltage and current waveforms at the drain of a first transistor of the push-pull configuration for Class E characteristic of operation. Waveforms 26v E and 26i E indicate respective voltage and current waveforms at the drain of a second transistor of the push-pull configuration for Class E characteristic of operation. Similarly, waveforms 24v I and 24i I indicate respective voltage and current waveforms at the drain of a first transistor of the push-pull configuration for operation intermediate to Classes E and AB characteristics of operation. Waveforms 26v I and 26i I indicate respective voltage and current waveforms at the drain of a second transistor of the push-pull configuration for operation intermediate to Classes E and AB characteristics of operation. Likewise, waveforms 24v AB and 24i AB indicate respective voltage and current waveforms at the drain of a first transistor of the push-pull configuration for Class AB characteristic of operation. Waveforms 26v AB and 26i AB indicate respective voltage and current waveforms at the drain of a second transistor of the push-pull configuration for Class AB characteristic of operation.

As can be seen by comparing FIGS. 3A and 3C, waveforms 24v E and 26v E have a higher peak than waveforms 24v AB and 26 v AB. As can also be seen waveforms 24i E and 26i E remain at 0 current for longer periods than waveforms 24i AB and 26i AB. The waveforms of FIG. 3A for Class E indicate an approximate 10% increase in efficiency over the waveforms of FIG. 3C for Class AB.

In the various embodiments, the output CLC network of output module 18 also provides the added benefit of filtering out power amplifier transient or out of band energy. For example, in various embodiments, selected transient or out of band energy is reduced from 28 dB to 55 dB and other transient or out of band energy is reduced from 33 dB to 58 dB. The CLC network of output module 18 also isolates the switch modules 14a, 14b from load mismatches by adding loss and attenuates returned transient or out of band energy produced by a non-linear load. The transient and out of band energy rises rapidly during high voltage standing wave ratio (VSWR). Resistor R1 thus allows a portion of the reflected power to be dissipated.

Figure 4:
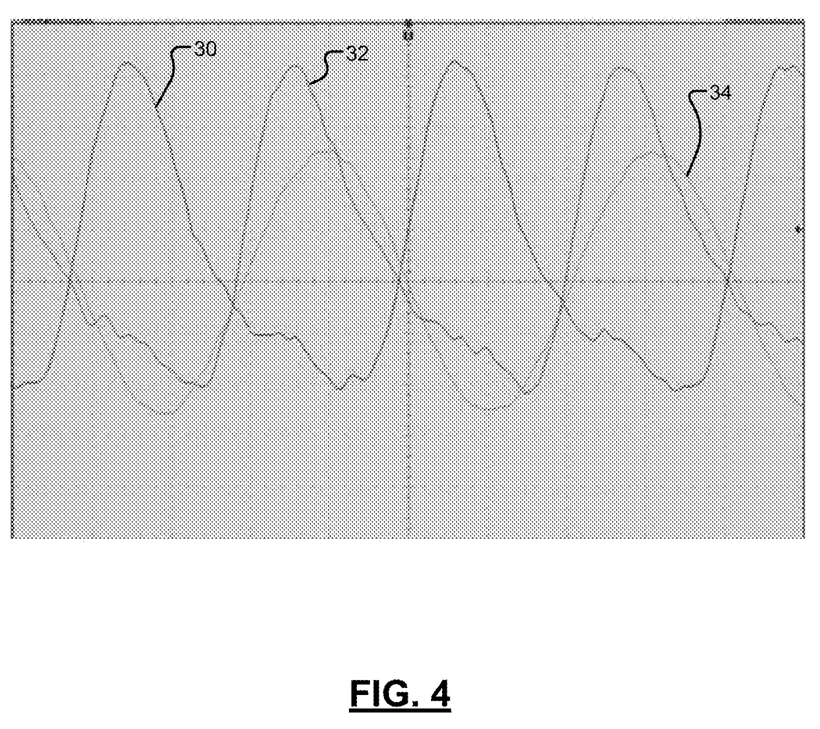
FIG. 4 depicts example waveforms of the output terminal voltages of the switch elements and main output of a variable class characteristic amplifier arranged in accordance with the principles of the present disclosure.

FIG. 4 shows voltage waveform 30 for an output terminal (drain) of an example first switch element Q1 and a voltage waveform 32 for an output terminal (drain) for an example second switch element Q2 of a variable class characteristic amplifier 10 arranged in accordance with the various embodiments. The waveforms of FIG. 4 correspond to operation in a Class E characteristic mode showing an efficiency of approximately 78% for an output power of approximately 600 watts and an RF gain of 16 dB. As can be seen from FIG. 4, the waveform shape in the vicinity of zero volts indicates that output transformer T2 has finite isolation between the drains of the respective switching elements. This finite isolation manifests itself when the signal breakthrough seen in proximity to when the other switching element nears its peak. FIG. 4 also depicts waveform 34 representing the output transformer T2 voltage applied to a 50 Ohm load.

Figure 5:
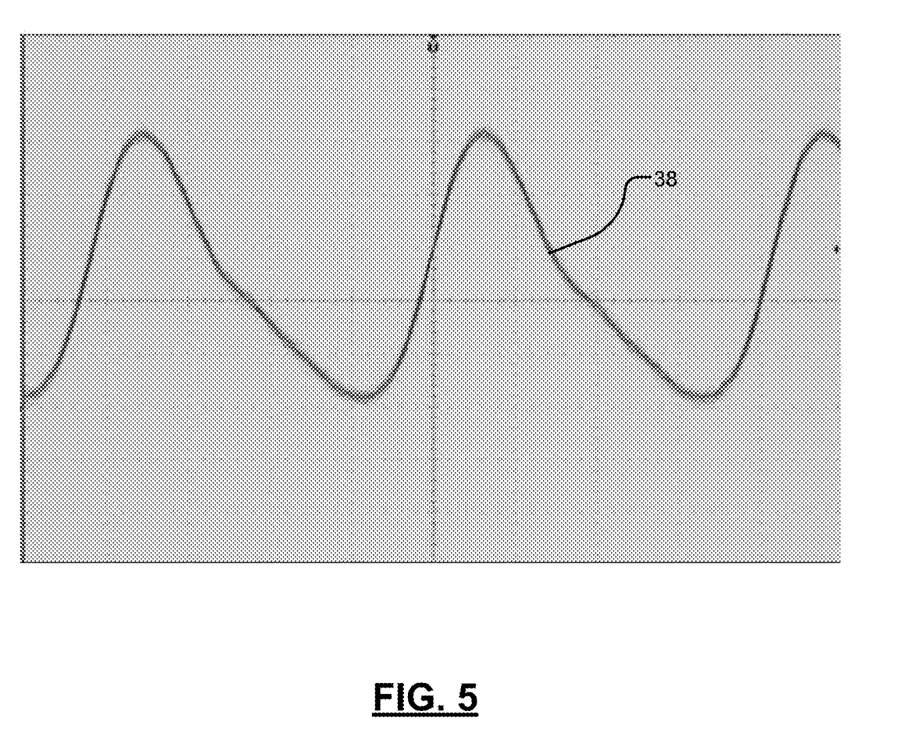
FIG. 5 depicts an example waveform of the drain voltage of a variable class characteristic amplifier operating in a Class AB characteristic in accordance with the principles of the present disclosure.

FIG. 5 depicts an example waveform showing an output terminal (drain) voltage 38 of an example switch element Q1 or Q2 when operation of a variable class characteristic waveform is moved towards the Class AB characteristic. Waveform 38 indicates that Class AB region terminates at around 450 watts output power. Class AB characteristic thus extends from about zero watts to approximately 450 watts and reaches a maximum efficiency at about 450 watts. The efficiency is higher at higher power and continues higher as variable class power amplifier 10 enters Class E characteristic operation. The highest efficiency occurs when the amplifier is saturated at its P3dB compression point which depends on the power supply voltage.

In various embodiments, output transformer T2, which may be implemented as a balun transformer, transforms the CLC output network impedance of output module 18 to a lower real and imaginary impedance. Thus, the CLC network provides the capability of adjusting the real and imaginary components at the outputs of switch elements Q1, Q2. By way of non-limiting example, the various values of output module 18 components enable tuning midway between Class AB and Class E characteristics of operation. In various embodiments, the CLC network of output module 18 transforms 50Ω to 490Ω−j68Ω (39 pF) in series at output transformer T2 secondary, which is transformed as an impedance of 5.2Ω+j3.1Ω (7.9 nH) between the push-pull output terminals of switch elements Q1, Q2. This includes the transformer leakage inductance. The measured gain in various embodiments is about 16.1 dB at 600 W output and 78% efficiency.

Figure 6:
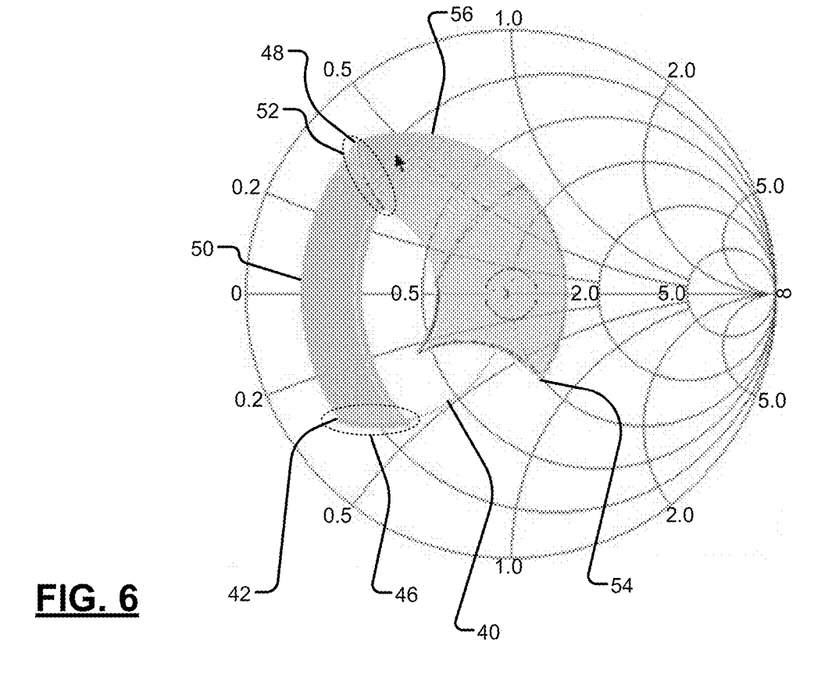
FIG. 6 is an example Smith Chart used in connection with demonstrating the variability in the CLC network to vary the class characteristic of operation of a variable class characteristic amplifier.

With reference to FIG. 6, FIG. 6 depicts a Smith Chart which in various embodiments indicates the impact of the adjustment of output module 18. Particularly, capacitors C5, C7, and inductor L6 of output module 18 can be varied in order to effect the operation of variable class characteristic power amplifier 10 between a Class AB characteristic of operation and Class E characteristic of operation. As can be seen in FIG. 6, the value of capacitor C7 of output module 18 defines an arc 40 terminating at a point 42. Varying the value of capacitor C7 over a range defines a set of points 46 corresponding to particular values of C7 along the arc 40. Similarly, selecting a value of inductor L6 of output module 18 determines a point 48 along an arc 50 that commences at point 42 and terminates at point 48. The set of points 52 correspond to the various values of capacitor C7 for a given value of inductor L6. Selecting a value of capacitor C5 of output module 18 leads to end point 54 along arc 56, starting from end point 48. Point 54 determines the impedance of the output CLC network in combination with the output load. FIG. 6 is instructive for indicating that varying capacitances C5 and C7 provides two degrees of freedom in both the real and the imaginary axis. Further, FIG. 6 indicates that in various embodiments, C7 is adjusted primarily, with lesser adjustment of capacitance C5, in order to vary operation of power amplifier 10 between Class AB characteristic and Class E characteristic.

Figure 7:
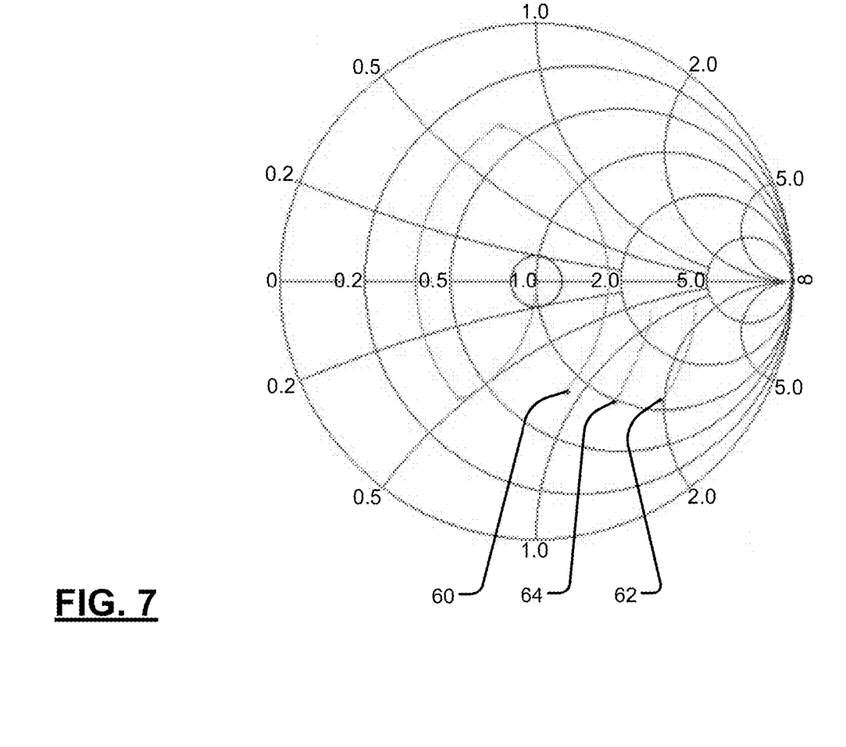
FIG. 7 is an example Smith Chart used in connection with demonstrating the variability in the CLC network for tuning arrangement.

FIG. 7 depicts a Smith Chart for a particular tuning arrangement of the variable class characteristic amplifier 10. Data point 60 indicates the CLC impedance for a particular tuning for Class E characteristic of operation according to various embodiments. Data point 62 indicates the CLC impedance for a particular tuning for Class AB characteristic of operation according to various embodiments. Data point 64 indicates the CLC impedance for a particular tuning for operation intermediate to Class E and Class AB according to various embodiments.

Figure 8:
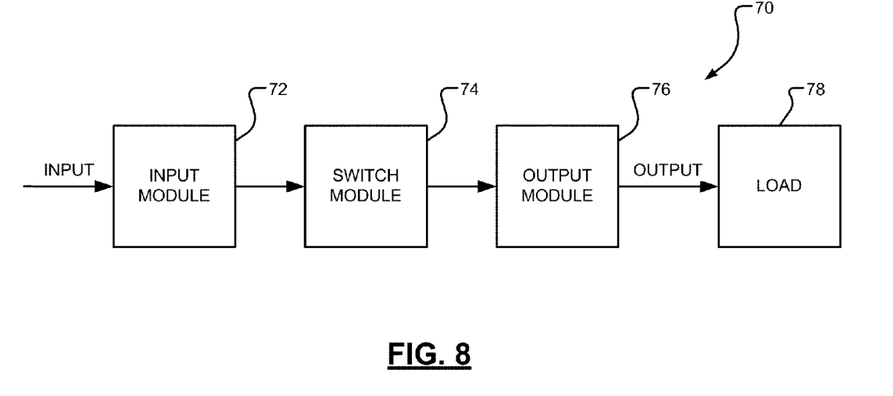
FIG. 8 depicts a block diagram of a variable class characteristic amplifier arranged in accordance with various embodiments of the principles of the present disclosure.

FIG. 8 depicts a variable class characteristic amplifier 70 according to various embodiments. Variable class amplifier will be described herein as a single ended amplifier. Variable class amplifier 70 receives an input signal applied to input module 72, which provides impedance transformation between the input to input module 72 and switch module 74, according to various embodiments. Output from input module 72 is applied to switch module 74, which is responsive to the input signal to provide a switch signal to output module 76. Output module 76 in turn generates an output signal applied to a load 78.

Figure 9:
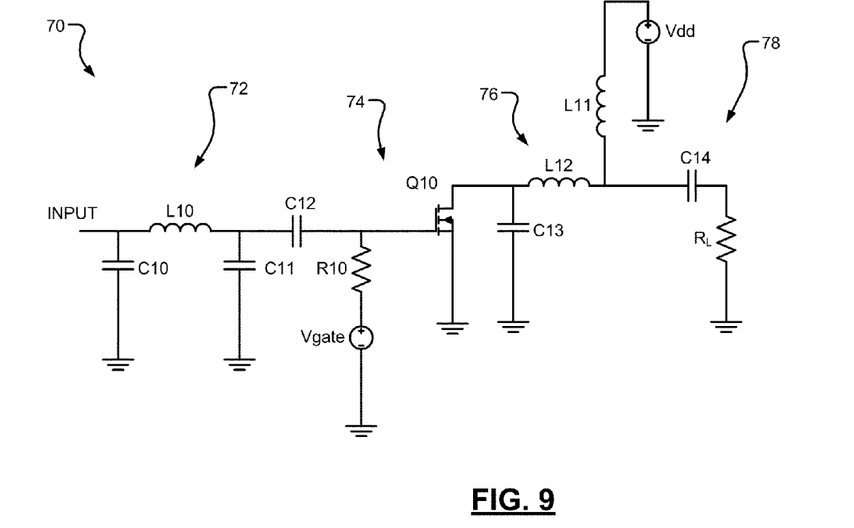
FIG. 9 is a circuit diagram of a variable class characteristic amplifier arranged in accordance with the various embodiments of the present disclosure.

FIG. 9 depicts a circuit corresponding to at least portions of FIG. 8. Input module 72 receives an input signal. Input module 72 includes a CLC circuit having capacitors C10, C11, and inductor L14. The output from CLC circuit, which forms a portion of input module 72, is applied to a gate of switch element Q10 through a DC blocking capacitor C12. Switch element Q10 is shown in FIG. 9 as a MOSFET, but one skilled in the art will recognize other switch elements can be used rather than a MOSFET. The gate of switch element Q10 is biased by voltage source formed by Vgate and resistor R10.

Variable class characteristic amplifier 70 is arranged as a single ended amplifier. Accordingly, the drain of switch element Q10 is connected to a voltage source Vdd through an inductor L11 in series with inductor L12. The output from switching element Q10 is input to output module 76 which includes a CLC output circuit including capacitor C13, inductor L12, and capacitor C14. The output from output module 76 is applied to load 78, shown in FIG. 9 as resistor $R_L$.

In operation, the variable class characteristic principles of FIGS. 8 and 9 are similar to that of FIGS. 1 and 2, but variable class characteristic amplifier 70 is arranged as a single-ended amplifier rather than a pair of switching elements arranged in a push-pull configuration. By varying the value of capacitor C14 and resistor $R_L$ of output module 76, operation of variable class characteristic amplifier 70 can be varied from between Class AB and Class E characteristics of operation. Further in operation, according to various embodiments, to move from Class AB characteristic to Class E characteristic, the value of capacitor C14 is raised and $R_L$ is lowered, which enables the class characteristic of amplifier 70 to vary for a given input signal.

Figure 10A:
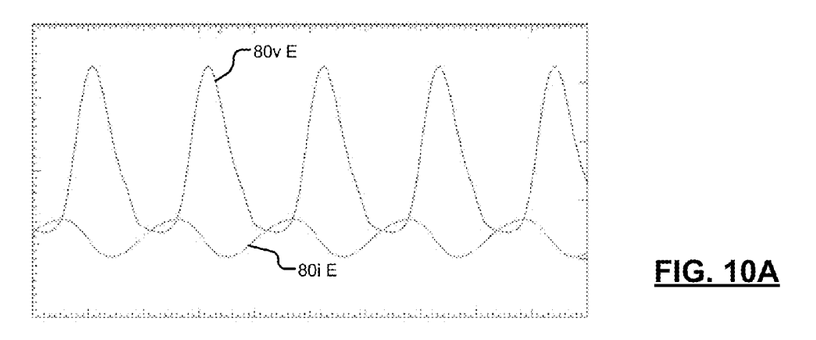
FIGS. 10A-10C depicts example waveforms of the output terminal voltage and current in various characteristics of operation of a variable class characteristic amplifier arranged in a single-ended configuration in accordance with the principles of the present disclosure.
Figure 10B:
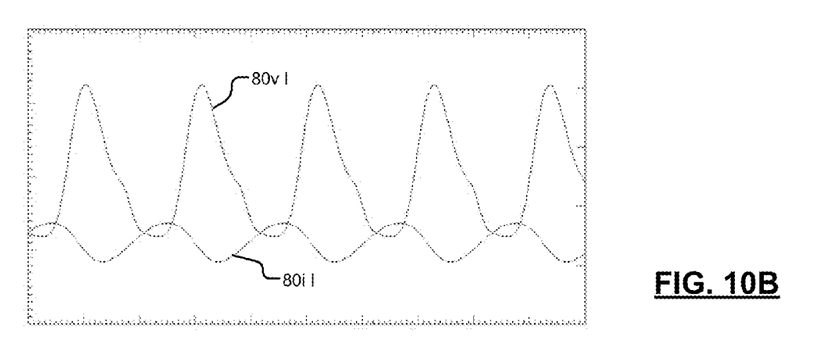
Figure 10C:
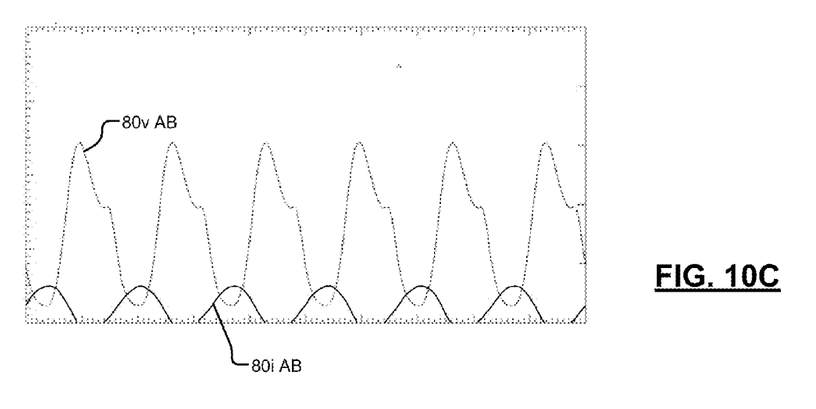

FIGS. 10A-10C are example plots showing voltage and current waveforms at the output terminal (the drain of Q10) for an example embodiment of a 60 MHz single-ended variable class characteristic power amplifier arranged according to various embodiments. FIGS. 10A-10C demonstrate an example relationship between output terminal drain voltage 80v and output terminal drain current 80i for respective Class E, intermediate, and Class AB characteristic modes of operation. Waveforms 80v E and 80i E indicate respective voltage and current waveforms at the drain of a transistor in a single-ended configuration for Class E characteristic of operation. Similarly, waveforms 80v I and 80i I indicate respective voltage and current waveforms at the drain of a transistor in a single-ended configuration for operation intermediate to Classes E and AB characteristics of operation. Likewise, waveforms 80v AB and 80i AB indicate respective voltage and current waveforms at the drain of a transistor in a single-ended configuration for Class E characteristic of operation.

As can be seen by comparing FIGS. 10A and 10C, waveform 80v E has a higher peak than waveform 80v AB. As can also be seen waveforms 80i E remains at 0 current for longer periods than waveform 80i AB and 26i AB. The waveforms of FIG. 10A for Class E indicate an approximate 10% increase in efficiency over the waveforms of FIG. 10C for Class AB.

Various embodiments of the variable class characteristic amplifier described herein dump transient and out of band energy into the power supply feed resistor R1, which helps improve transistor reliability and circuit stability during conditions of high output power and high VSWR loads. In various embodiments, stable circuit operation into infinite VSWR loads of all phases is enhanced by not connecting the center tap of input transformer T1, which may be a balun transformer, to ground. By leaving the connection floating, tuned resonances are removed from the input side of switch modules 14a, 14b which otherwise interfere with circuit operation when high RF power is reflected back to the transistor drains from a mismatch load. In various embodiments, the reflected RF reaches the transistor gates due to the Cgd capacitance, and the overall power amplifier S-parameter S12 characteristics.

In various embodiments, during high output power and when there is a high VSWR load, the transients and out of band energy can appear at the center tap of the output transformer T2, whereas the fundamental does not. In various embodiments, a R1 resistor value of, by way of non-limiting example, between 5 to 10Ω will effectively dump some of the reflected power from the high VSWR load, thus helping to isolate and protect the push-pull transistors from excessive high voltages and currents. This improves circuit stability and helps to prevent spurious outputs.

In various embodiments, the output modules 18, 76 components are tuned to produce the desired class characteristic operation with its useful efficiency and load pull stability aspects. In general, the higher the conduction angle of switch modules 14a, 14b, 74 and the longer the outputs of switch modules 14a, 14b, 74 are in a matched impedance on state, the greater the margin of stability will be, and hence the lower the probability of spurious outputs during high VSWR loads.

Various embodiments provide higher efficiency which translates to lower running costs and better reliability. Further, flexible tuning between Class AB and Class E characteristics provides more responsive power control. While operating in Class E characteristic mode, the various embodiments have softer limiting at the top of the dynamic power range which reduces the responsiveness of the system output power control, which may not be desirable in some applications. Further, various embodiments provide a lower cost design because of the minimalist design with fewer components. The less complex variable class characteristic power amplifier 10, 70 provides for a reduced size, which can result in improved power density. Various embodiments also provide better reliability by reduced switch module 14a, 14b, 74 transistor stress and fewer components.

Various embodiments also improve stability into open cable loads (infinite VSWR), producing only very low levels of spurious outputs. By way of example, this is provided by transient and out of band energy being absorbed into a 10 Ohm load and a floating input transformer. Various embodiments also substantially limit such transient and out of band energy due to low pass characteristics of output module 18, 76 tuning. In a similar way to an isolator, high reflected power is dissipated into a resistive load. Since the fundamental frequency is attenuated at the transformer T2 center tap, the effects on efficiency during normal operation are minimal.

In various embodiments when tuned for Class AB characteristic operation, the load line presented between the output of switch modules 14a, 14b is optimized for maximum power transfer and gain. The resulting waveform is approximately double the power supply voltage Vdd as is expected under Class AB characteristic operation. In various embodiments, when tuned for Class E characteristic operation, the resistive load line is tuned to a lower impedance, and hence the Q of the series resonator is higher. This mismatched load line with higher Q results in a higher peak to peak output voltage, which implies that the switch elements Q1, Q2, Q10 are conducting while the output voltage is near 0V. This results in improved efficiency, but at the expense of slightly lower gain and output power.

In various embodiments, output transformer T2 has the effect of transforming a series resistance and capacitance of, by way of non-limiting example, 49 ohms and 39 pF (produced by the CLC of output module 18 and 50 Ohms of load 20) at its secondary output, to a series impedance of 5.2 ohms and 7.9 nH (including transformer leakage inductance) at its primary input between the two transistor drains. By adjusting this series impedance it is possible to adjust between a Class AB conjugate match and a Class E output resonator.

In various embodiments, the output waveforms of switch modules 14a, 14b are similar in form to Class AB amplifiers until the last end portion of the dynamic range before saturation, where it then enters a region characteristic of Class E amplifiers. Depending on the requirements, the output module 18, 76 tuning of the Class E characteristics of operation region can be tuned more towards Class AB characteristic of operation for maximum output power and load pull stability or more towards Class E for peak efficiency.

Various embodiments provide a push-pull power amplifier topology circuit design and output network tuning, which allows the variable class characteristic power amplifiers 10, 70 to be adjusted or tuned over a continuous range between Class AB and Class E characteristics of operation using the same printed circuit board design. In various embodiments, this allows the variable class characteristic power amplifiers 10, 70 to be tuned to maximum efficiency which also satisfies stable operation into infinite VSWR at all phases. In various embodiments, a series inductance is provided by the transformer T2 leakage and the series capacitance moved to the transformer secondary and provided by a CLC impedance transformation network. The various embodiments may be used in the output stage of any RF power amplifier or RF generator. Equivalent output network designs can be synthesized for any frequency band from low MHz up to GHz.

Power amplifiers 10, 70 operate at a lower output power, but still have better efficiency. In various embodiments, the output tuning of the power amplifier may be effected individually or through the combination of module 18 and the matching network. In various embodiments, the circuit design limits infinite VSWR loads from the switch modules 14a, 14b outputs by providing a dissipative load for transients and out of band energy, thus providing a partial alternative to an RF isolator which is not practical at low RF frequencies. Other various embodiments provide impedance transformation with a series capacitive match for Class E characteristic operation. The output CLC impedance transformation networks of output modules 18, 76 also provide for directly combining two push-pull power amplifier outputs without isolation.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:
1. A power amplifier, comprising:
a switch module, the switch module receiving an input signal and generating a switch module signal in accordance with the input signal;
a transformer module, the transformer module receiving the switch module signal and generating a transformer signal; and
an output module, the output module receiving the transformer signal and generating an output signal based on the transformer signal, wherein the power amplifier operates in a plurality of modes, each of the plurality of modes characteristic of a respective one of a plurality of power amplifier classes, and wherein a value of a circuit component located within the output module is varied, based on the input signal, to switch between the plurality of modes of the power amplifier.

2. The power amplifier of claim 1 wherein the switch module includes a switching element, the switching element being responsive to the input signal to generate a voltage and a current across the switching element.

3. The power amplifier of claim 2 wherein the output module includes at least a capacitive element and an inductive element, wherein the value of the capacitive element may be one of increased or decreased to cause operation in a first mode.

4. The power amplifier of claim 3 wherein the value of the capacitive element may be the other of increased or decreased to cause operation in a second mode.

5. The power amplifier of claim 1 wherein one of the plurality of modes is Class AB and another of the plurality of modes is Class E.

6. The power amplifier of claim 1 wherein the switch module comprises a transistor.

7. The power amplifier of claim 6 wherein the transistor is a MOSFET device.

8. A power amplifier comprising:
a switch module, the switch module receiving an input signal and generating a switch module signal in accordance with the input signal;
a transformer module, the transformer module receiving the switch module signal and generating a transformer signal; and
an output module, the output module receiving the transformer signal and generating an output signal, the output module including at least a capacitor and an inductor,
wherein the power amplifier operates in a plurality of modes, each of the plurality of modes characteristic of a respective one of a plurality of power amplifier classes, and wherein the value of the capacitor is varied, based on the input signal, to switch between the plurality of modes of the power amplifier.

9. The power amplifier of claim 8 wherein the value of the capacitor may be one of increased or decreased to cause operation in a first mode.

10. The power amplifier of claim 9 wherein the value of the capacitor may be the other of increased or decreased to cause operation in a second mode.

11. The power amplifier of claim 8 wherein one of the plurality of modes is Class AB and another of the plurality of modes is Class E.

12. The power amplifier of claim 11 wherein the switch module comprises a transistor.

13. The power amplifier of claim 12 wherein the transistor is a MOSFET device.

14. A power amplifier comprising:
a first switch module, the first switch module responsive to an input signal and generating a first switch module signal in accordance with the input signal;
a second switch module arranged in a push-pull configuration with the first switch module, the second switch module responsive to the input signal and generating a second switch module signal in accordance with the input signal, the first and second switch module signals cooperating to generate a composite switch module signal;
a transformer module, the transformer module receiving the composite switch module signal and generating a transformer signal; and
an output module, the output module receiving the transformer signal and generating an output signal,
wherein the power amplifier operates in a plurality of modes, each of the plurality of modes characteristic of a respective one of a plurality of power amplifier classes, and wherein a value of a circuit component located within the output module is varied, based on the input signal, to switch between the plurality of modes of the power amplifier.

15. The power amplifier of claim 14 wherein the output module includes at least an inductive element and a first capacitive element.

16. The power amplifier of claim 15 further comprising a second capacitive element.

17. The power amplifier of claim 14 wherein the first switch module comprises a first switch element, and the second switch module comprises a second switch element.

18. The power amplifier of claim 17 wherein the first switch element includes a first transistor device and the second switch element includes a second transistor device, and wherein the output terminals of the first and second transistors are connected through the transformer module to form the push-pull arrangement.

19. The power amplifier of claim 18 wherein the transformer module includes a primary and a secondary winding and wherein the output terminals of the first and second transistors are connected to respective first and second terminals of the primary winding.

20. The power amplifier of claim 19 further comprising a voltage source electrically communicating with at least one of the output terminals of the first and second transistors through at least a portion of the primary winding.

21. The power amplifier of claim 20 further comprising an inductance interposed between the voltage source and the at least a portion of the primary winding.

22. The power amplifier of claim 14 wherein the output module further comprises a network including an inductor and a first a capacitor.

23. The power amplifier of claim 22 wherein the output module further comprises a second capacitor, the first and second capacitor and the inductor being arranged in a CLC network.

24. A power amplifier comprising:
a first switch module, the first switch module being responsive to an input signal and generating a first switch module signal in accordance with the input signal;
a second switch module arranged in a push-pull configuration with the first switch module, the second switch module responsive to the input signal and generating a second switch module signal in accordance with the input signal, the first and second switch module signals cooperating to generate a composite switch module signal;
a transformer module, the transformer module receiving the composite switch module signal and generating a transformer signal; and
an output module, the output module receiving the transformer signal and generating an output signal, the output module including a first capacitive element and an inductive element,
wherein the power amplifier operates in a plurality of modes, each of the plurality of modes characteristic of a respective one of a plurality of power amplifier classes, and wherein the value of the capacitive element is varied, based on the input signal, to switch between the plurality of modes of the power amplifier.

25. The power amplifier of claim 24 wherein the first switch module includes a first switch element and the second switch module includes a second switch element, the switch elements being responsive to the input signal to generate voltage and current across the switch element.

26. The power amplifier of claim 24 wherein the capacitive element is one of increased or decreased to cause operation in a first mode.

27. The power amplifier of claim 26 wherein the capacitive element may be the other of increased or decreased to cause operation in a second mode.

28. The power amplifier of claim 26 further comprising a second capacitive element, wherein the first capacitive element, the second capacitive element, and the inductive element are arranged in PI network.

29. The power amplifier of claim 24 wherein the first switch module comprises a first switch element, and the second switch module comprises a second switch element.

30. The power amplifier of claim 29 wherein the first and second switch elements comprise transistors.

31. The power amplifier of claim 24 wherein the transformer modules includes a primary and a secondary winding and wherein the first and second switch modules include respective first and second output terminals, wherein the first and second output terminals are connected to respective first and second terminals of the primary winding.

32. The power amplifier of claim 31 further comprising a voltage source electrically communicating with at least one of the output terminals of the first and second switch modules through at least a portion of the primary winding.

33. The power amplifier of claim 32 further comprising an inductive element interposed between the voltage source and the at least a portion of the primary winding.

34. The power amplifier of claim 24 wherein one of the plurality of modes is Class AB and another of the plurality of modes is Class E.

35. A power amplifier comprising:
a first switching device, the first switching device responsive to an input signal to generate a first switching device signal;
a second switching device arranged in a push-pull configuration with the first switching device, the second switching device responsive to the input signal to generate a second switching device signal, the first and second switching device signals cooperating to generate a composite switching device signal;
a transformer module, the transformer module receiving the composite switching device signal and generating a transformer signal; and
an output module, the output module receiving the transformer signal and generating an output signal, the output module including a first capacitor and an inductor,
wherein the power amplifier operates in a plurality of modes, each of the plurality of modes characteristic of a respective one of Class AB or Class E power amplifier classes, and wherein the value of the capacitor is varied, based on the input signal, to switch between the plurality of modes of the power amplifier.

36. The power amplifier of claim 35 wherein the first switching device and the second switching device are responsive to the input signal to generate voltage and current across the respective switching elements.

37. The power amplifier of claim 35 wherein the value of the first capacitor is one of increased or decreased to cause operation in a first mode.

38. The power amplifier of claim 37 wherein the value of the first capacitor may be the other of increased or decreased to cause operation in a second mode.

39. The power amplifier of claim 35 wherein increasing the value of the first capacitor causes operation in a Class E mode and decreasing the value of the first capacitor causes operation in Class AB mode.

40. The power amplifier of claim 35 further comprising a second capacitor, wherein the first capacitor, the second capacitor, and the inductor are arranged in PI network, and the first capacitor electrically communicates with a terminal of the inductor opposite the terminal that receives the composite switching device signal.

41. The power amplifier of claim 35 wherein the first and second switching devices comprise respective first and second transistors.

42. The power amplifier of claim 41 wherein the first and second transistor devices are MOSFET devices.

43. The power amplifier of claim 35 wherein the transformer module includes a primary and a secondary winding and wherein the first and second switching devices include respective first and second output terminals, wherein the first and second output terminals are connected to respective first and second terminals of the primary winding.

44. The power amplifier of claim 43 further comprising a voltage source electrically communicating with at least one of the output terminals of the first and second switching devices through at least a portion of the primary winding.

45. The power amplifier of claim 43 further comprising a voltage supply inductor interposed between the voltage source and the at least a portion of the primary winding.

46. The power amplifier of claim 45 further comprising a resistive element in parallel with the voltage supply inductor.

* * * * *